United States Patent
Liu et al.

(10) Patent No.: US 11,545,962 B2
(45) Date of Patent: Jan. 3, 2023

(54) PHASE SHIFTING DEVICE, DRIVING METHOD THEREOF AND ANTENNA

(71) Applicants: Beijing BOE Technology Development Co., Ltd., Beijing (CN); BOE TECHNOLOGY GROUP CO., LTD., Beijing (CN)

(72) Inventors: Zongmin Liu, Beijing (CN); Zhiliang Wang, Beijing (CN); Wei Li, Beijing (CN); Xichao Fan, Beijing (CN); Junwei Guo, Beijing (CN); Feng Qu, Beijing (CN); Biqi Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/552,732

(22) Filed: Dec. 16, 2021

(65) Prior Publication Data

US 2022/0311422 A1    Sep. 29, 2022

(30) Foreign Application Priority Data

Mar. 23, 2021 (CN) .......................... 202110308120.8

(51) Int. Cl.
*H01Q 3/36* (2006.01)
*H03H 11/16* (2006.01)

(52) U.S. Cl.
CPC ............... *H03H 11/16* (2013.01); *H01Q 3/36* (2013.01)

(58) Field of Classification Search
CPC .......... H03H 11/16; H01Q 3/36; H01Q 3/242
See application file for complete search history.

(56) References Cited

U.S. PATENT DOCUMENTS

| 2016/0012911 A1* | 1/2016 | Han | G11C 19/28 |
| | | | 377/64 |
| 2018/0329547 A1* | 11/2018 | Wu | G06F 3/0412 |
| 2019/0103671 A1* | 4/2019 | Dong | H01Q 1/364 |
| 2019/0304561 A1* | 10/2019 | Wang | G09G 3/3258 |
| 2021/0005979 A1* | 1/2021 | Chiu | H01Q 1/38 |

FOREIGN PATENT DOCUMENTS

WO    WO-2019007043 A1 * 1/2019 ............... G09G 3/20

* cited by examiner

*Primary Examiner* — Awat M Salih
(74) *Attorney, Agent, or Firm* — Nath, Goldberg & Meyer; Joshua B. Goldberg (57) ABSTRACT

The present disclosure provides a phase shifting device, a driving method thereof, and an antenna. The phase shifting device of the present disclosure includes: data lines, scan lines and phase shifting units. Each phase shifting unit includes: a switch sub-circuit and a phase shifter. Control terminals of the switch sub-circuits in a same row are coupled to a same scan line, first terminals of the switch sub-circuits in a same column are coupled to a same data line, and a second terminal of each switch sub-circuit is coupled to a phase shifter included in the phase shifting unit to which the switch sub-circuit belongs. Each switch sub-circuit is configured to transmit, in response to a switch control signal provided by the scan line, a data voltage signal provided by the data line to the phase shifter to drive the phase shifter.

15 Claims, 6 Drawing Sheets

PHASE SHIFTING DEVICE, DRIVING METHOD THEREOF AND ANTENNA

CROSS-REFERENCE TO RELATED APPLICATION

The present disclosure claims the benefit of priority to Chinese patent application No. 202110308120.8 filed on Mar. 23, 2021, the contents of which are incorporated herein in their entirety by reference.

TECHNICAL FIELD

The present disclosure belongs to the technical field of wireless communication, and particularly relates to a phase shifting device, an antenna including the phase shifting device and a driving method of the phase shifting device.

BACKGROUND

Phased array antennas are preferred by consumers in communication and radar applications because they do not require the precise moving parts of conventional mechanical scanning antennas. The phased array antenna adopting the liquid crystal phase shifter becomes a research hotspot of the phased array antenna due to its characteristics of low cost and low profile.

SUMMARY

In a first aspect, the present disclosure provides a phase shifting device including: a plurality of data lines, a plurality of scan lines and a plurality of phase shifting units;

each of the plurality of phase shifting units includes: a switch sub-circuit and a phase shifter;

control terminals of the switch sub-circuits in a same row are coupled to a same scan line, first terminals of the switch sub-circuits in a same column are coupled to a same data line, and a second terminal of each switch sub-circuit is coupled to the phase shifter included in the phase shifting unit to which the switch sub-circuit belongs; and each switch sub-circuit is configured to transmit, in response to a switch control signal provided by the scan line coupled to the control terminal of the switch sub-circuit, a data voltage signal provided by the data line coupled to the first terminal of the switch sub-circuit to the phase shifter coupled to the second terminal of the switch sub-circuit to drive the phase shifter.

In an embodiment of the present disclosure, the phase shifter includes a first electrode and a second electrode opposite to each other, and a dielectric layer between the first electrode and the second electrode, the first electrode is coupled to the second terminal of a corresponding switch sub-circuit to receive the data voltage signal, and the second electrode is coupled to a reference voltage terminal.

In an embodiment of the present disclosure, the phase shifting device further includes a data voltage generation sub-circuit coupled to the plurality of data lines and configured to supply the data voltage signals to the plurality of data lines.

In an embodiment of the present disclosure, the data voltage generation sub-circuit includes: a controller, a digital-to-analog converter and a level shifter, the controller, the digital-to-analog converter and the level shifter are sequentially coupled in series, an output terminal of the level shifter is coupled to the plurality of data lines, the controller is configured to provide a digital control signal to the analog-to-digital converter;

the digital-to-analog converter is configured to convert the digital control signal provided by the controller into an analog signal and to transmit the analog signal to the level shifter; and the level shifter is configured to convert the analog signal transmitted by the digital-to-analog converter into the data voltage signal, and transmit the data voltage signal to the switch sub-circuits through the plurality of data lines.

In an embodiment of the present disclosure, the phase shifting device further includes a driving circuit coupled to the plurality of scan lines and configured to sequentially supply the switch control signal to the plurality of scan lines.

In an embodiment of the present disclosure, the driving circuit includes first and second driving sub-circuits which are different. Each scan line in an odd-numbered row is coupled to the first driving sub-circuit; and each scan line in an even-numbered row is coupled to the second driving sub-circuit.

In an embodiment of the present disclosure, each of the scan lines includes first and second ends opposite to each other. The first ends of the scan lines in odd-numbered rows are coupled to the first driving sub-circuit; and the second ends of the scan lines in even-numbered rows are coupled to the second driving sub-circuit.

In an embodiment of the present disclosure, the phase shifting device includes a plurality of driving circuits, the plurality of scan lines are divided into a plurality of groups, each group of scan lines is coupled to a corresponding one of the driving circuits, each driving circuit includes first and second driving sub-circuits which are different. In each group of scan lines, each scan line in an odd-numbered row is coupled to the first driving sub-circuit in a corresponding driving circuit; and each scan line in an even-numbered row is coupled to the second driving sub-circuit in a corresponding driving circuit.

In an embodiment of the present disclosure, the phase shifter further includes a first substrate and a second substrate opposite to each other; the first electrode and the switch sub-circuit are on a side of the first substrate close to the dielectric layer, and the second electrode is on a side of the second substrate close to the dielectric layer.

In an embodiment of the present disclosure, the phase shifter further includes a first sub-electrode sheet on the first substrate, an orthographic projection of the first sub-electrode sheet on the first substrate is at least partially overlapped with an orthographic projection of the second electrode on the first substrate, and the first sub-electrode sheet is coupled to the first electrode.

In an embodiment of the present disclosure, the switch sub-circuit includes a switch transistor, a source of the switch transistor being the first terminal of the switch sub-circuit, a drain of the switch transistor being the second terminal of the switch sub-circuit, and a gate of the switch transistor being the control terminal of the switch sub-circuit.

In an embodiment of the present disclosure, the source and the drain of the switch transistor are in the same layer as the first electrode.

In an embodiment of the present disclosure, the first electrode includes a microstrip line, and the second electrode has an opening therein.

In a second aspect, the present disclosure provides an antenna, including the phase shifting device described above.

In a third aspect, the present disclosure provides a method for driving a phase shifting device, the phase shifting device being the phase shifting device described above, the method including:

sequentially providing the switch control signal to the plurality of scan lines; and during a period of providing the switch control signal to each scan line, turning on the switch sub-circuits in the phase shifting units coupled to the scan line, such that the data voltage signals provided by the plurality of data lines are transmitted to the phase shifters in the phase shifting units coupled to the scan line to drive the phase shifters.

DETAIL DESCRIPTION OF EMBODIMENTS

In order that those skilled in the art will better understand the technical solutions of the present disclosure, the following detailed description is given with reference to the accompanying drawings and the specific embodiments.

Unless defined otherwise, technical or scientific terms used herein shall have the ordinary meaning as understood by one of ordinary skill in the art to which this disclosure belongs. The use of "first", "second", and the like in this disclosure is not intended to indicate any order, quantity, or importance, but rather is used to distinguish one element from another. Also, the term "a", "an", "the" or the like does not denote a limitation of quantity, but rather denotes the presence of at least one. The word "include", "comprise", or the like, means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
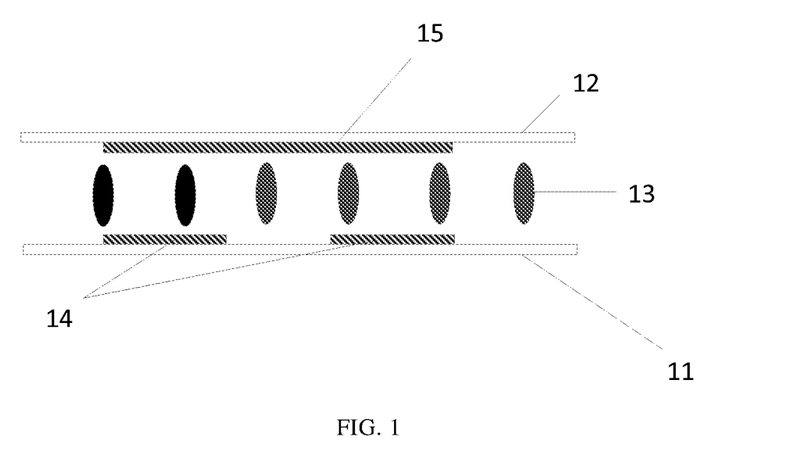
FIG. 1 is a cross-sectional view of an exemplary phase shifter.

FIG. 1 is a cross-sectional view of an exemplary phase shifter. As shown in FIG. 1, the phase shifter includes: a first substrate 11 and a second substrate 12 which are oppositely arranged, a dielectric layer 13 between the first substrate 11 and the second substrate 12, a first electrode 14 and a second electrode 15. The first substrate 11 and the second substrate 12 are configured to support and accommodate the dielectric layer 13, the first electrode 14 is disposed on a side of the first substrate 11 close to the dielectric layer 13, the second electrode 15 is disposed on a side of the second substrate 12 close to the dielectric layer 13, and orthographic projections of the first electrode 14 and the second electrode 15 on the substrate are at least partially overlapped.

It should be noted that the material of the dielectric layer 13 may be liquid crystal, inert gas, or the like, and in the embodiments of the present disclosure, the dielectric layer 13 is described as a liquid crystal layer as an example. The first and second substrates 11 and 12 may be formed of an insulating material, for example, the material of the first and second substrates 11 and 12 may be polyimide (PI), glass, or the like.

During the operation of the liquid crystal phase shifter, by applying voltages to the first electrode 14 and the second electrode 15, respectively, an electric field is formed between the first electrode 14 and the second electrode 15, and liquid crystal molecules in the liquid crystal layer 13 are deflected under the electric field, so that the dielectric constant $\varepsilon$ of the liquid crystal layer 13 is changed. The relationship between the transmission speed v of the microwave signal and the dielectric constant $\varepsilon$ is as follows: $v=c/\sqrt{\varepsilon}$, where c represents the transmission speed of the microwave signal under the vacuum condition. When the microwave signal is transmitted on the first electrode 14, the transmission speed v of the microwave signal changes due to the change of the dielectric constant $\varepsilon$ of the liquid crystal layer 13, so that under the condition that the lengths of the first electrodes 14 are the same, the different transmission speed v of the microwave signal can make the phase of the output microwave signal different, and thus the phase shift of the microwave signal is realized.

In order to realize continuous control of phase shifting degree of the liquid crystal phase shifter, a high-precision digital-to-analog converter is generally selected to output the driving voltage to the liquid crystal phase shifter. However, the number of channels of the digital-to-analog converter is limited. To meet the requirement of G/T value, the gain is usually increased by increasing the number of array elements of antenna to offset the insertion loss of the liquid crystal phase shifter. In order to meet the requirement for driving a large number of channels of liquid crystal phase shifters, a plurality of digital-to-analog converters are often provided, thereby increasing the number of devices in use and the cost. In addition, since when the liquid crystal phase shifters are driven, all channels are simultaneously driven, that is, the driving voltages are simultaneously supplied to the first electrodes 14 of the phase shifters of all channels, and the supply of the driving voltages is continuous, there is a problem of large power consumption.

In order to solve at least one of the above technical problems, an embodiment of the present disclosure provides a phase shifting device and an antenna. The phase shifting device and the antenna provided in the embodiments of the present disclosure will be described in further detail below with reference to the following specific embodiments and the accompanying drawings.

Figure 2:
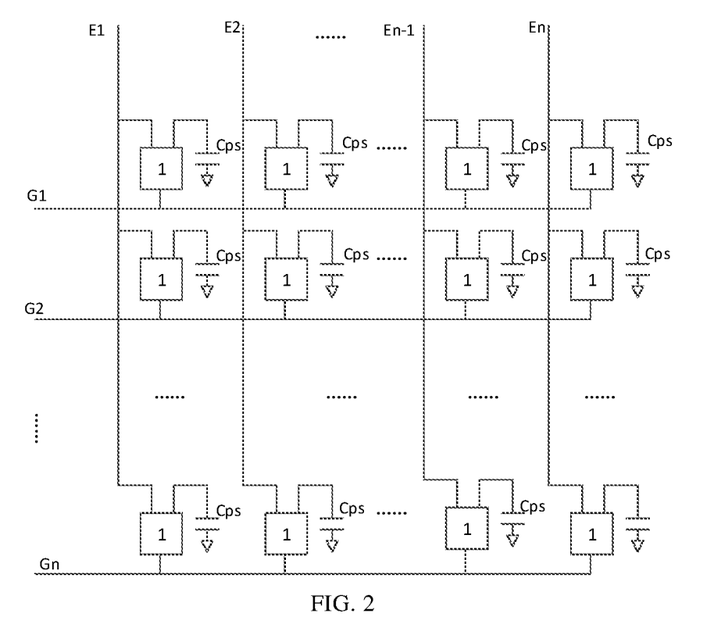
FIG. 2 is a schematic structure diagram of a phase shifting device according to an embodiment of the present disclosure.

In a first aspect, an embodiment of the present disclosure provides a phase shifting device. FIG. 2 is a schematic structure diagram of a phase shifting device according to an embodiment of the present disclosure. As shown in FIG. 2, the phase shifting device includes: a plurality of data lines (E1~En), a plurality of scan lines (G1~Gn), and a plurality of phase shifting units. The plurality of data lines (E1~En) are configured to transmit data voltage signals, and the plurality of scan lines (G1~Gn) are configured to transmit switch control signals. Each phase shifting unit includes a switch sub-circuit 1 and a phase shifter. The phase shifter has a structure as shown in FIG. 1, for example, and includes a first electrode 14 and a second electrode 15 which are oppositely disposed, and a dielectric layer 13 disposed between the first electrode 14 and the second electrode 15. The first electrode and the second electrode of the phase shifter are oppositely arranged to form a phase shifter capacitor Cps. In FIG. 2, the upper plate of the phase shifter capacitor Cps represents the first electrode 14 of the phase shifter, and the lower plate of the phase shifter capacitor Cps represents the second electrode 15 of the phase shifter.

Figure 9:
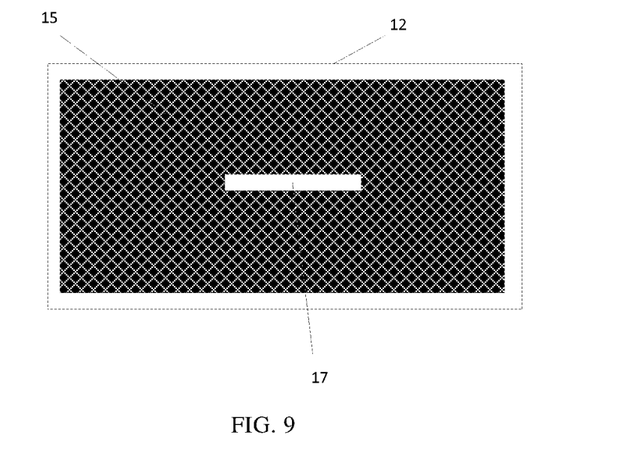
FIG. 9 is a top view of a phase shifter according to an embodiment of the present disclosure, when viewed in a direction from a second substrate to a first substrate.

It should be noted that the switch sub-circuits 1 in the embodiments of the present disclosure may all be the same. The shapes of the first electrodes 14 may be different or the same. In the embodiment of the present disclosure, the description will be given by taking the case that the first electrodes 14 have the same shape as an example. It is understood that, in the case where the shapes of the first electrodes 14 are the same and the second electrodes 15 are also the same, the phase shifter capacitors Cps in FIG. 2 are all the same. When the shapes of the first electrodes 14 are different, the phase shifter capacitors Cps in FIG. 2 are different. It is within the scope of the present disclosure that the phase shifter capacitors Cps may be the same or different. In the embodiment of the present disclosure, description is given by taking the case that the first electrode 14 is a microstrip line in a strip shape and the second electrode 15 is a plate electrode as an example. Since the microwave signal is to enter the phase shifter by means of spatial coupling, as shown in FIG. 9, an opening 17 is provided in the plate electrode 15.

With continued reference to FIG. 2, control terminals of the switch sub-circuits 1 in the same row are coupled to the same scan line, first terminals of the switch sub-circuits 1 in the same column are coupled to the same data line, and a second terminal of each switch sub-circuit 1 is coupled to the phase shifter included in the phase shifting unit to which the switch sub-circuit 1 belongs. Each switch sub-circuit 1 is configured to transmit, in response to a switch control signal supplied by a corresponding scan line (G1~Gn), a data voltage signal supplied by a corresponding data line (E1~En) to a corresponding phase shifter to drive the phase shifter. In the embodiment of the present disclosure, as shown in FIG. 2, the second terminal of each switch sub-circuit 1 is coupled to the upper plate (i.e., the first electrode 14) of the phase shifter capacitor Cps, and the lower plate (i.e., the second electrode 15) of the phase shifter capacitor Cps is coupled to the reference voltage terminal.

As shown in FIG. 2, when the switch control signal is provided to the scan line G1 of the first row, all the switch sub-circuits 1 coupled to the scan line G1 of the first row are turned on, and the switch sub-circuits 1 transmit the data voltage signals provided by the data lines (E1 to En) to all the phase shifter capacitors Cps of the first row, so as to charge all the phase shifter capacitors Cps of the first row; when the charging of all the phase shifter capacitors Cps in the first row is completed, the supply of the switch control signal to the scan line G1 of the first row is stopped, thereby turning off the switch sub-circuits 1 of the first row; then, the switch control signal is supplied to the scan line G2 of the second row, all the switch sub-circuits 1 coupled to the scan line G2 of the second row are turned on, and the data voltage signals provided by the data lines (E1 to En) are transmitted to all the phase shifter capacitors Cps of the second row through the switch sub-circuits 1, so as to charge all the phase shifter capacitors Cps of the second row; in this way, the scan lines are supplied with the switch control signal line by line, so that the switch sub-circuits 1 are turned on row by row, thereby loading the first electrodes 14 of the phase shifters with data voltage signals row by row. It will be understood that the switch control signal for the respective rows must be strictly controlled to not overlap in time.

In the embodiment of the present disclosure, the second terminal of the switch sub-circuit 1 is coupled to the first electrode 14, the control terminals of the switch sub-circuits 1 in the same row are coupled to the same scan line, the first terminals of the switch sub-circuits 1 in the same column are coupled to the same data line, and the switch sub-circuit 1 is configured to transmit, in response to the switch control signal provided by the scan line, the data voltage signal provided by the data line to the first electrode 14 of the phase shifter. Thus, the switch control signal only needs to be refreshed regularly or provided according to the beamforming requirement in the present disclosure, and compared with the case of simultaneously loading the data voltages to the first electrodes 14 of the liquid crystal phase shifters, the purpose of driving a large number of liquid crystal phase shifters with fewer devices is achieved, and the power consumption of the system is reduced.

Figure 3:
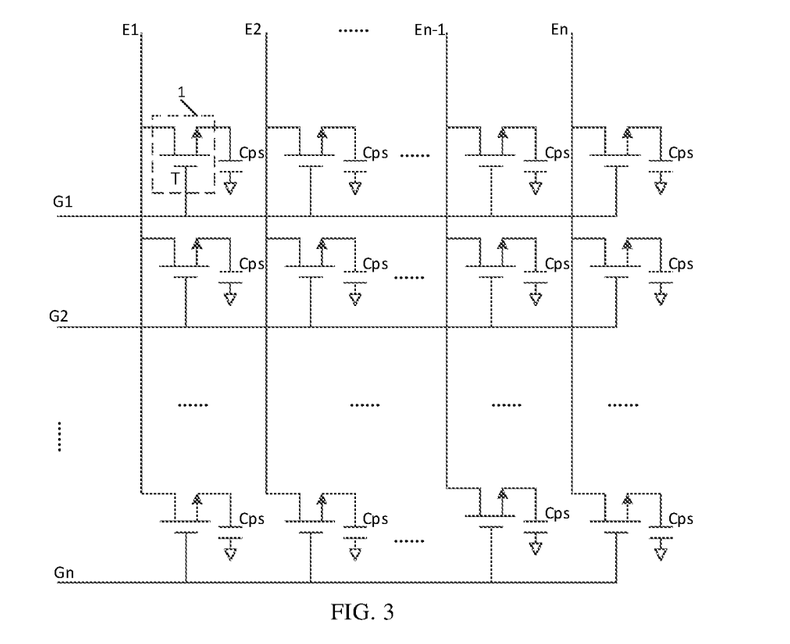
FIG. 3 is a schematic structure diagram of another phase shifting device according to an embodiment of the present disclosure.

FIG. 3 is a schematic structure diagram of another phase shifting device according to an embodiment of the present disclosure. In some embodiments, as shown in FIG. 3, the switch sub-circuit 1 includes a switch transistor T, a source of the switch transistor T is coupled to the corresponding data line (E1~En), a drain of the switch transistor T is coupled to the first electrode 14 of the corresponding phase shifter, and a gate of the switch transistor T is coupled to the corresponding scan line (G1~Gn).

It should be noted that the switch transistor adopted in the embodiments of the present disclosure may be a thin film transistor, a field effect transistor or other devices with the same characteristics. Since the source and the drain of the transistor are symmetrical, the source and the drain are indistinguishable. Further, transistors may be classified into N-type and P-type according to their characteristics, and the following embodiments will be described by taking N-type transistors as an example. In the case that an N-type transistor is used, the source electrode and the drain electrode are connected when a high level is input to the gate. It is contemplated that implementations with P-type transistors will be readily apparent to one skilled in the art without creative effort and thus are within the scope of the embodiments of the present disclosure.

In addition, in the embodiments of the present disclosure, all transistors are described as N-type transistors as an example, the operating level refers to an active level for turning on the N-type transistors, that is, a high level, and the non-operating level refers to a low level. The switch control signal in the embodiments of the present disclosure is a fixed operating level, for example, a fixed high level signal.

As shown in FIG. 3, when the switch control signal is supplied to the scan line G1 of the first row, all the switch transistors T coupled to the scan line G1 of the first row are turned on, and the switch transistors T transmit the data voltage signals provided by the data lines (E1~En) to all the phase shifter capacitors Cps of the first row, so as to charge all the phase shifter capacitors Cps of the first row; when the charging of all the phase shifter capacitors Cps of the first row is completed, the supply of the switch control signal to the scan line G1 of the first row is stopped, thereby turning off the switch transistors T of the first row; then, when the switch transistors T of the first row are all turned off, the switch control signal is supplied to the scan line G2 of the second row, all the switch transistors coupled to the scan line G2 of the second row are turned on, and the switch transistors transmit the data voltage signals provided by the data lines (E1 to En) to all the phase shifter capacitors Cps of the second row, so that all the phase shifter capacitors Cps of the second row are charged; when the charging of all the phase shifter capacitors Cps of the second row is completed, the supply of the switch control signal to the scan line G1 of the second row is stopped, thereby turning off the switch transistors T of the second row; in this way, the scan lines are supplied with the switch control signal line by line, so that the switch transistors are turned on row by row, thereby loading the first electrodes 14 of the phase shifters with data voltage signals row by row.

In the embodiments of the present disclosure, the drain of the switch transistor is coupled to the first electrode 14 of the phase shifter, the gates of the switch transistors in the same row are coupled to the same scan line, the sources of the switch transistors in the same column are coupled to the same data line, and the switch transistor is configured to transmit, in response to the switch control signal provided by the scan line, the data voltage signal provided by the data line to the first electrode 14 of the phase shifter. Thus, the switch control signal only needs to be refreshed regularly or provided according to the beamforming requirement in the present disclosure, and compared with the case of simultaneously loading the data voltages to the first electrodes 14 of the liquid crystal phase shifters, the purpose of driving a large number of liquid crystal phase shifters with fewer devices is achieved, and the power consumption of the system is reduced.

It should be noted that above description is given by taking the implementation that the switch sub-circuit 1 includes the switch transistor as an example. Needless to say, the above implementation is only an exemplary structure of the embodiments of the present disclosure, and does not constitute a limitation to the scope of the present disclosure, and it should be understood that any switch sub-circuit capable of writing the data voltage signal into the first electrode of the phase shifter in response to the switch control signal is within the scope of the present disclosure.

Figure 4:
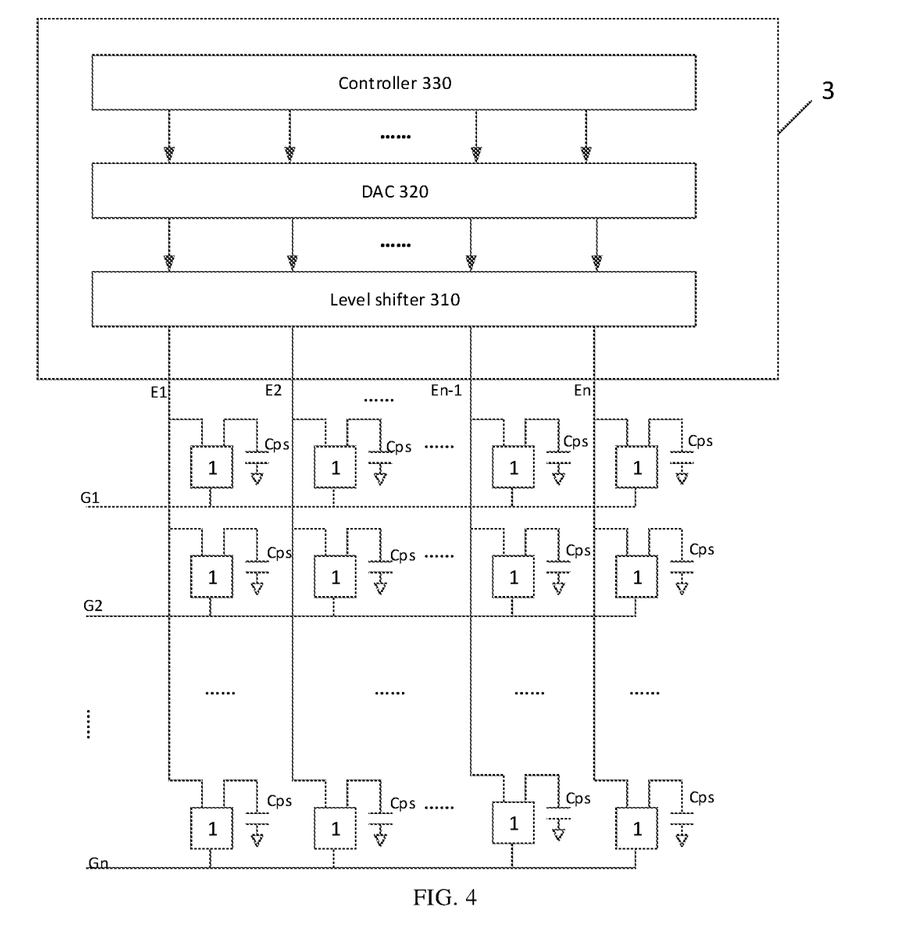
FIG. 4 is a schematic structure diagram of yet another phase shifting device according to an embodiment of the present disclosure.

FIG. 4 is a schematic structure diagram of yet another phase shifting device according to an embodiment of the present disclosure. In some embodiments, as shown in FIG. 4, the phase shifting device further includes a data voltage generation sub-circuit 3 coupled to the plurality of data lines (E1~En) and configured to supply the data voltage signal to each of the data lines (E1~En).

In an embodiment of the present disclosure, the data voltage generation sub-circuit 3 includes: a controller 330, a digital-to-analog converter (DAC) 320, and a level shifter 310. The controller 330, the DAC 320 and the level shifter 310 are sequentially coupled in series. An input terminal of the level shifter 310 is coupled to the analog-to-digital converter 320, and an output terminal of the level shifter 310 is coupled to the plurality of data lines (E1~En). The controller 330 is configured to provide a digital control signal to the analog-to-digital converter 320, and the DAC 320 is configured to convert the digital control signal provided by the controller 330 into an analog signal and transmit the analog signal to the level shifter 310. The level shifter 310 is configured to convert the analog signal transmitted by the DAC 320 into the data voltage signal, and transmit the data voltage signal to the switch sub-circuit 1 via the data line (E1~En). In the embodiments of the present disclosure, the controller 330 may be a processor such as an FPGA or an MCU; the DAC 320 may be, for example, DAC60096; the level shifter 310 may be an amplifier. In the embodiments of the present disclosure, since the data voltage generation sub-circuit 3 of the phase shifting device includes the controller 330, the DAC 320, and the level shifter 310, high voltage driving of the liquid crystal phase shifter is achieved.

Figure 5:
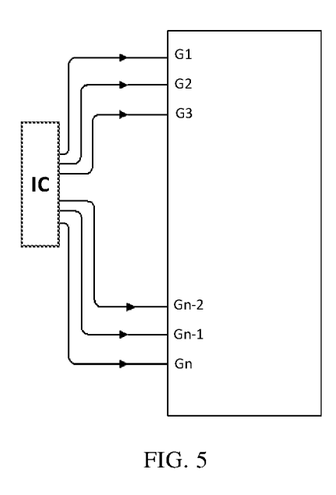
FIG. 5 is a schematic diagram illustrating connection between a driving circuit and scan lines in a phase shifting device according to an embodiment of the present disclosure.

In some embodiments, the phase shifting device further includes a driving circuit IC coupled to the plurality of scan lines (G1~Gn), and configured to sequentially supply the switch control signal to the plurality of scan lines. FIG. 5 is a schematic structure diagram illustrating connection between the driving circuit and the scan lines according to an embodiment of the present disclosure. As shown in FIG. 5, output terminals of the driving circuit IC are coupled to the scan lines (G1~Gn) respectively, and the phase shifting device includes only one driving circuit IC configured to supply the switch control signal to the scan lines (G1~Gn) in sequence. The driving circuit IC can be a TFT LCD gate driver, such as HX8677.

In the embodiment of the present disclosure, since the driving circuit IC is configured to sequentially supply the switch control signal to the scan lines (G1~Gn), on/off states of the switch sub-circuits 1 of respective rows can be sequentially controlled, thereby sequentially controlling the writing of the data voltage signals on the first electrodes 14 of the liquid crystal phase shifters of respective rows. Compared with the case of simultaneously loading the data voltages to the first electrodes 14 of the liquid crystal phase shifters, the purpose of driving a large number of liquid crystal phase shifters with fewer devices is achieved, and the power consumption of the system is reduced.

The refresh cycle of the phase shifter capacitor Cps cannot exceed a certain time, and if the refresh cycle exceeds the certain time, the previously charged phase shifter capacitor Cps has a problem of electric leakage. Therefore, in order to avoid the electric leakage of the charged capacitor, a different number of driving circuit ICs may be used for driving according to the number of the scan lines.

In the embodiments of the present disclosure, for example, the phase shifter with an inverted microstrip line structure is adopted, the length of the phase shifting line is about 180 mm, the line width is about 0.2 mm, the liquid crystal dielectric constant ranges from 2.3616 to 3.0169, the liquid crystal cell thickness is 0.1 mm, and the capacitance of the phase shifter is estimated to be about 9.616 pF; a-Si TFT with the width-to-length ratio of 10 um:10 um may be used to charge the phase shifter capacitor Cps, and the charging time for 10%-90% of a negative extremum to a positive extremum is about 20 μs. Therefore, in order to ensure the timeliness of beam scanning, the refresh period of the liquid crystal phase shifter capacitor is required to be not more than 5 ms, and the time can only satisfy the charging of the liquid crystal phase shifter capacitors of not more than 250 rows. For the antenna array with the row number not more than 250, one driving circuit IC may be adopted; if the number of rows exceeds 250, a plurality of driving circuit ICs are adopted according to the actual number of rows for driving in groups, such as odd-even cross driving, upper and lower chip area driving and the like.

Several examples are given below.

In some embodiments, the phase shifting device further includes a driving circuit, the driving circuit includes a first driving sub-circuit and a second driving sub-circuit which are different, each scan line in the odd-numbered row is coupled to the first driving sub-circuit, and each scan line in the even-numbered row is coupled to the second driving sub-circuit.

Figure 6:
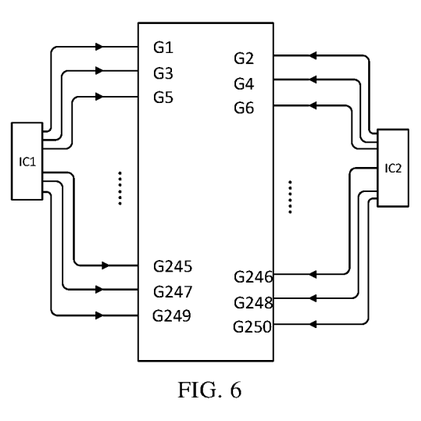
FIG. 6 is a schematic diagram illustrating another connection of a driving circuit and scan lines in a phase shifting device according to an embodiment of the present disclosure.

FIG. 6 is a schematic diagram illustrating another connection between the driving circuit and the scan lines according to an embodiment of the present disclosure. The present embodiment is described by taking 250 scan lines as an example. It will be appreciated that the number of scan lines may be unlimited for different application scenarios. As shown in FIG. 6, the phase shifting device further includes a first driving sub-circuit IC1 and a second driving sub-circuit IC2, the first driving sub-circuit IC1 is coupled to the scan lines in odd-numbered rows, and the second driving sub-circuit IC2 is coupled to the scan lines in even-numbered rows. In this embodiment, the first driving sub-circuit IC1 is coupled to the scan lines in the odd-numbered rows, and the second driving sub-circuit IC2 is coupled to the scan lines in the even-numbered rows, so that the refresh time of the switch control signal is shortened, the electric leakage of the charged capacitor is avoided, the timeliness of the beam scanning is ensured, and the accuracy of the phase shift of the microwave signal is ensured.

In some embodiments, as shown in FIG. 6, any one of the scan lines includes first and second ends opposite to each other; the first ends of the scan lines in the odd-numbered rows are coupled to the first driving sub-circuit IC1, and the second ends of the scan lines in the even-numbered rows are coupled to the second driving sub-circuit IC2.

In the present embodiment, by connecting the first driving sub-circuit IC1 to the first ends of the scan lines in the odd-numbered rows and connecting the second driving sub-circuit IC2 to the second ends of the scan lines of the even-numbered rows, wiring is made easier and parasitic capacitance between the lines is reduced.

In some embodiments, the scan lines are divided into a plurality of groups (by region), the phase shifting device includes a plurality of driving circuits, each group of scan lines is coupled to a corresponding one of the driving circuits, and each driving circuit includes a first driving sub-circuit and a second driving sub-circuit which are different; in each group of scan lines, each scan line in the odd-numbered row is coupled to the first driving sub-circuit in the corresponding driving circuit; and each scan line in the even-numbered row is coupled to the second driving sub-circuit in the corresponding driving circuit.

Figure 7:
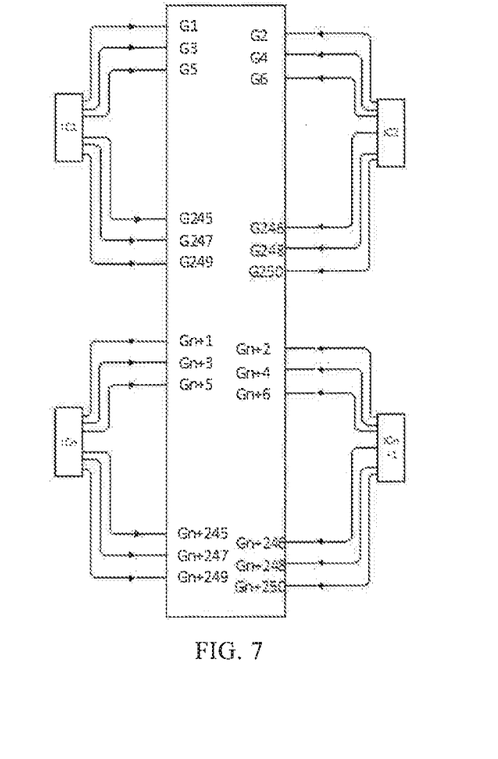
FIG. 7 is a schematic diagram illustrating yet another connection of a driving circuit and scan lines in a phase shifting device according to an embodiment of the present disclosure.

FIG. 7 is a schematic diagram illustrating yet another connection between the driving circuit and the scan lines according to an embodiment of the present disclosure. The present embodiment is described by taking the case that the number of scan lines is greater than 250 as an example. As shown in FIG. 7, the scan lines are divided into a plurality of groups, each group is provided with a driving circuit, IC1 and IC2 are a first driving sub-circuit and a second driving sub-circuit in the first group, respectively, ICn and ICn+1 are a first driving sub-circuit and a second driving sub-circuit in a (n+1)/2-th group, respectively, and the driving circuits in the other groups have similar structures. The first driving sub-circuit IC1 is coupled to the scan lines (G1, G3, G5 . . . G245, G247, G249) in the odd-numbered rows in the first group, and the second driving sub-circuit IC2 is coupled to the scan lines (G2, G4, G6 . . . G246, G248, G250) in the even-numbered rows in the first group; the first driving sub-circuit ICn is coupled to the scan lines (Gn+1, Gn+3, Gn+5 . . . Gn+245, Gn+247, Gn+249) in the odd-numbered rows in the (n+1)/2-th group; the second driving sub-circuit ICn+1 is coupled to the scan lines (Gn+2, Gn+4, Gn+6 . . . Gn+246, Gn+248, Gn+250) in the even-numbered rows in the (n+1)/2-th group.

In this embodiment, the scan lines are divided into a plurality of groups, and in each group of scan lines, the scan lines in the odd-numbered rows are coupled to the same driving sub-circuit, and the scan lines in the even-numbered rows are coupled to the same driving sub-circuit. Therefore, the refresh time of the switch control signal is shortened, the problem of electric leakage of the charged capacitor is avoided, the timeliness of beam scanning is ensured, and the accuracy of phase shift of the microwave signal is further ensured.

It can be understood that the arrangement of the driving circuit ICs is not limited to the above examples, and may be implemented in any way, as long as it is ensured that the corresponding function is implemented. The above examples do not limit the scope of the present disclosure.

In some embodiments, the phase shifter further includes a first substrate and a second substrate disposed opposite to each other, the first electrode and the switch sub-circuit are disposed on a side of the first substrate close to the dielectric layer, and the second electrode is disposed on a side of the second substrate close to the dielectric layer. For example, when the switch sub-circuit includes a switch transistor and the dielectric layer is a liquid crystal layer, the first electrode and the switch transistor are disposed on a side of the first substrate close to the liquid crystal layer.

In some embodiments, the source and the drain of the switch transistor are arranged in the same layer as the first electrode. The source and the drain of the switch transistor are arranged in the same layer as the first electrode, so that the manufacturing steps are reduced, and the production cost is saved.

Figure 8:
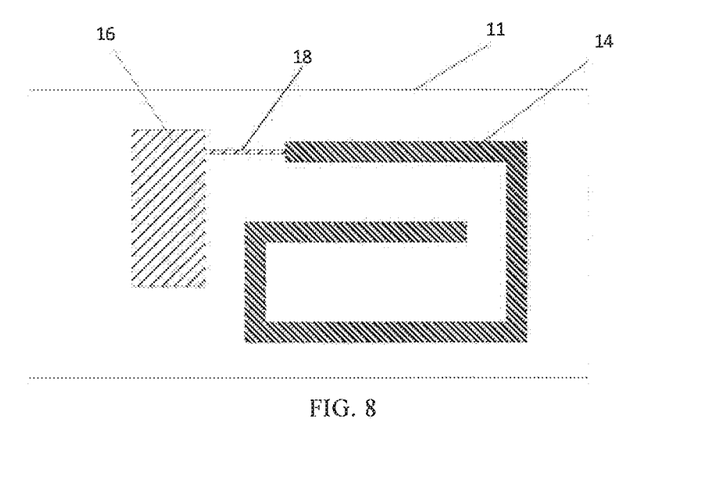
FIG. 8 is a top view of a phase shifter according to an embodiment of the present disclosure, when viewed in a direction from a first substrate to a second substrate.

FIG. 8 is a top view of a phase shifter according to an embodiment of the present disclosure, when viewed in a direction from the first substrate to the second substrate. In some embodiments, as shown in FIG. 8, the first electrode 14 may be a microstrip line, the phase shifter further includes a first sub-electrode sheet 16, the first sub-electrode sheet 16 is disposed on the first substrate 11, an orthographic projection of the first sub-electrode sheet 16 on the first substrate 11 is at least partially overlapped with an orthographic projection of the second electrode 15 on the first substrate 11, and the first sub-electrode sheet 16 is coupled to the microstrip line through a very thin ITO (indium tin oxide) material 18 with high resistivity. In this embodiment, a storage capacitor is formed by the first sub-electrode sheet 16 and the second electrode 15, that is, the storage capacitor is connected in parallel to the phase shifter capacitor Cps in FIG. 2, so as to prevent the phase shifter capacitor Cps from leaking electricity during the driving process of the liquid crystal phase shifter. When the phase shifter capacitor Cps leaks electricity, the storage capacitor can supplement the electricity leaked from the phase shifter capacitor Cps, thereby ensuring the accuracy of phase shift of the microwave signal. In addition, the first sub-electrode sheet 16 is coupled to the microstrip line through a very thin ITO material with high resistivity, so that the radio-frequency signal is prevented from leaking to the storage capacitor, and the insertion loss of the phase shifter is ensured to be minimized.

In a second aspect, embodiments of the present disclosure provide an antenna, which includes any one of the phase shifting devices according to the foregoing embodiments.

In a third aspect, embodiments of the present disclosure provide a method for driving a phase shifting device. The phase shifting device may be any one of the phase shifting devices according to the above embodiments. The method includes: sequentially supplying the switch control signal to the plurality of scan lines; and during the period of supplying the switch control signal to each scan line, turning on the switch sub-circuit in the phase shifting unit coupled to the scan line, so that the data voltage signals provided by the plurality of data lines are transmitted to the phase shifters in the phase shifting units coupled to the scan line to drive the phase shifters.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A phase shifting device comprising: a plurality of data lines, a plurality of scan lines and a plurality of phase shifting units;
   wherein each of the plurality of phase shifting units comprises: a switch sub-circuit and a phase shifter;
   control terminals of the switch sub-circuits in a same row are coupled to a same scan line, first terminals of the switch sub-circuits in a same column are coupled to a same data line, and a second terminal of each switch sub-circuit is coupled to the phase shifter comprised in the phase shifting unit to which the switch sub-circuit belongs; and
   each switch sub-circuit is configured to transmit, in response to a switch control signal provided by the scan line coupled to the control terminal of the switch sub-circuit, a data voltage signal provided by the data line coupled to the first terminal of the switch sub-circuit to the phase shifter coupled to the second terminal of the switch sub-circuit to drive the phase shifter.

2. The phase shifting device of claim 1, wherein the phase shifter comprises a first electrode and a second electrode opposite to each other, and a dielectric layer between the first electrode and the second electrode, the first electrode is coupled to the second terminal of a corresponding switch sub-circuit to receive the data voltage signal, and the second electrode is coupled to a reference voltage terminal.

3. The phase shifting device of claim 2, wherein the phase shifter further comprises a first substrate and a second substrate opposite to each other; the first electrode and the switch sub-circuit are on a side of the first substrate close to the dielectric layer, and the second electrode is on a side of the second substrate close to the dielectric layer.

4. The phase shifting device of claim 3, wherein the phase shifter further comprises a first sub-electrode sheet on the first substrate, an orthographic projection of the first sub-electrode sheet on the first substrate is at least partially overlapped with an orthographic projection of the second electrode on the first substrate, and the first sub-electrode sheet is coupled to the first electrode.

5. The phase shifting device of claim 2, wherein the switch sub-circuit comprises a switch transistor, a source of the switch transistor being the first terminal of the switch sub-circuit, a drain of the switch transistor being the second terminal of the switch sub-circuit, and a gate of the switch transistor being the control terminal of the switch sub-circuit.

6. The phase shifting device of claim 5, wherein the source and the drain of the switch transistor are in the same layer as the first electrode.

7. The phase shifting device of claim 2, wherein the first electrode comprises a microstrip line, and the second electrode has an opening therein.

8. The phase shifting device of claim 1, further comprising a data voltage generation sub-circuit coupled to the plurality of data lines and configured to supply the data voltage signals to the plurality of data lines.

9. The phase shifting device of claim 8, wherein the data voltage generation sub-circuit comprises: a controller, a digital-to-analog converter and a level shifter,
   the controller, the digital-to-analog converter and the level shifter are sequentially coupled in series, an output terminal of the level shifter is coupled to the plurality of data lines,
   the controller is configured to provide a digital control signal to the analog-to-digital converter;
   the digital-to-analog converter is configured to convert the digital control signal provided by the controller into an analog signal and to transmit the analog signal to the level shifter; and
   the level shifter is configured to convert the analog signal transmitted by the digital-to-analog converter into the data voltage signal, and transmit the data voltage signal to the switch sub-circuits through the plurality of data lines.

10. The phase shifting device of claim 1, further comprising a driving circuit coupled to the plurality of scan lines and configured to sequentially supply the switch control signal to the plurality of scan lines.

11. The phase shifting device of claim 10, wherein the driving circuit comprises first and second driving sub-circuits which are different, and
    each scan line in an odd-numbered row is coupled to the first driving sub-circuit; and each scan line in an even-numbered row is coupled to the second driving sub-circuit.

12. The phase shifting device of claim 11, wherein each of the plurality of scan lines comprises first and second ends opposite to each other; and
    the first ends of the scan lines in odd-numbered rows are coupled to the first driving sub-circuit; and the second ends of the scan lines in even-numbered rows are coupled to the second driving sub-circuit.

13. The phase shifting device of claim 10, wherein the phase shifting device comprises a plurality of driving circuits, the plurality of scan lines are divided into a plurality of groups, each group of scan lines is coupled to a corresponding one of the plurality of driving circuits, each driving circuit comprises first and second driving sub-circuits which are different,
    in each group of scan lines, each scan line in an odd-numbered row is coupled to the first driving sub-circuit in a corresponding driving circuit; and each scan line in an even-numbered row is coupled to the second driving sub-circuit in a corresponding driving circuit.

14. An antenna, comprising the phase shifting device of claim 1.

15. A method for driving a phase shifting device, the phase shifting device being the phase shifting device of claim 1, the method comprising:
- sequentially providing the switch control signal to the plurality of scan lines; and
- during a period of providing the switch control signal to each scan line, turning on the switch sub-circuits in the phase shifting units coupled to the scan line, such that the data voltage signals provided by the plurality of data lines are transmitted to the phase shifters in the phase shifting units coupled to the scan line to drive the phase shifters.

* * * * *